United States Patent
Tanaka et al.

(10) Patent No.: US 8,120,209 B2
(45) Date of Patent: *Feb. 21, 2012

(54) VOLTAGE SENSING DEVICE FOR AN INDIVIDUAL CELL OF A GROUP OF BATTERY CELLS

(75) Inventors: Toru Tanaka, Setagaya (JP); Akio Ogura, Yokohama (JP); Kazuya Omagari, Inagi (JP); Nariaki Ogasawara, Yokohama (JP)

(73) Assignee: Texas Instruments Incorporated, Dallas, TX (US)

( * ) Notice: Subject to any disclaimer, the term of this patent is extended or adjusted under 35 U.S.C. 154(b) by 64 days.

This patent is subject to a terminal disclaimer.

(21) Appl. No.: 12/553,404

(22) Filed: Sep. 3, 2009

(65) Prior Publication Data
US 2010/0090540 A1   Apr. 15, 2010

(30) Foreign Application Priority Data
Sep. 3, 2008   (JP) .................................. 2008-226500

(51) Int. Cl.
*H01H 31/10* (2006.01)
*H01H 33/59* (2006.01)
*H01H 47/00* (2006.01)
*H01H 85/46* (2006.01)
*H01H 19/14* (2006.01)

(52) U.S. Cl. .......... 307/115; 307/77; 307/112; 307/113; 320/116; 320/117; 320/118; 320/119; 320/120; 320/121; 320/122; 320/123; 340/636.1; 340/636.11; 340/636.12; 340/636.13; 340/636.14; 340/636.15; 340/636.16; 340/636.17; 340/636.18; 340/636.19; 340/636.2; 340/636.21; 429/90; 429/91; 324/426; 324/433; 324/434; 324/605; 324/606; 324/607; 324/608; 324/609; 327/58; 327/62; 327/63; 327/68; 327/71; 327/74; 327/75

(58) Field of Classification Search .................. 307/115, 307/9.1, 10.177, 112, 113, 116–123; 320/116–123, 320/132, 136, 149; 340/636.1, 636.12, 636.13, 340/636.15; 429/90, 91; 324/426, 433, 434, 324/605–609; 327/58, 62, 63, 68, 71, 74, 327/75
See application file for complete search history.

(56) References Cited

U.S. PATENT DOCUMENTS
5,712,568 A * 1/1998 Flohr et al. ..................... 324/434
(Continued)

FOREIGN PATENT DOCUMENTS
JP   2001-264366 A   9/2001

OTHER PUBLICATIONS
JP Pub 2003-282158 to Kudo et al., english abstract, Oct. 3, 2003.*
(Continued)

*Primary Examiner* — Rexford Barnie
*Assistant Examiner* — Justen Fauth
(74) *Attorney, Agent, or Firm* — William B. Kempler; Wade J. Brady, III; Frederick J. Telecky, Jr.

(57) ABSTRACT

A voltage sensing device with which high-precision voltage sensing is possible without the need to obtain a unique correction constant for each device. A pair of voltage input nodes NCk and NCk-1 is selected from voltage input nodes NC0-NCn in switch part 10, and they are connected to sensing input nodes NA and NB in two types of patterns with different polarity (forward connection, reverse connection). Sensing input nodes NA and NB are held at reference potential Vm by voltage sensing part 20, and current Ina and Inb corresponding to the voltage at voltage input nodes NCk and NCk-1 flows to input resistors RIk and RIk-1. Currents Ina and Inb are synthesized at different ratios in voltage sensing part 20, and sensed voltage signal S20 is generated according to the synthesized current Ic. Sensed voltage data S40 with low error is generated according to the difference between the two sensed voltage signals S20 generated in the two connection patterns.

15 Claims, 10 Drawing Sheets

U.S. PATENT DOCUMENTS

| | | | |
|---|---|---|---|
| 6,104,164 A * | 8/2000 | Iino et al. | 320/116 |
| 6,373,226 B1 * | 4/2002 | Itou et al. | 320/132 |
| 2004/0160229 A1 * | 8/2004 | Fujita et al. | 324/607 |
| 2005/0242775 A1 * | 11/2005 | Miyazaki et al. | 320/116 |
| 2006/0091857 A1 * | 5/2006 | Nakanishi et al. | 320/116 |
| 2007/0029967 A1 * | 2/2007 | Morimoto | 320/116 |

OTHER PUBLICATIONS

JP Pub 2008-082731 to Ieoka, english abstract, Apr. 10, 2008.*

* cited by examiner

VOLTAGE SENSING DEVICE FOR AN INDIVIDUAL CELL OF A GROUP OF BATTERY CELLS

CROSS-REFERENCE TO RELATED APPLICATIONS

This patent application claims priority from Japanese Patent Application No. 2008-226500, filed 3 Sep. 2008 the entirety of which is incorporated herein by reference.

TECHNICAL FIELD

The present invention pertains to a voltage sensing device that senses voltage applied between nodes that have an electrical potential difference relative to a reference potential, and relates to a voltage sensing device that senses the voltage in each cell in multiple secondary battery cells that are connected in series, for example.

BACKGROUND OF THE INVENTION

When a battery supplies energy to the drive system in a hybrid automobile or the like, generally a voltage of around several hundred V is required. The battery is often configured by connecting many secondary cells, such as lithium ion batteries, in series. When many secondary cells are connected in series, the voltage varies because the individual cells have different characteristics. Then when charging, for example, the voltage in some cells may be excessive, and may cause problems such as damage or fire. For this reason, circuitry is generally provided to sense the voltage of each of the secondary cells connected in series to prevent an overvoltage.

The voltage sensing device described in FIG. 6 in Japanese Kokai Patent Application No. 2001-264366, for example, is provided with a multiplexer that selects two nodes via the individual connection nodes of the multiple cell modules connected in series, a voltage sensing differential amplifier that senses the voltage at the two nodes selected by the multiplexer, and a module voltage correcting part that corrects the voltage sensed by the voltage sensing differential amplifier based on a prescribed correction formula.

With the voltage sensing device described in Japanese Kokai Patent Application No. 2001-264366, a node of each cell module is first selected by the multiplexer from the multiple cell modules connected in series, and the voltage of the selected cell module is sensed by the voltage sensing differential amplifier. The sensed value is recorded in the module voltage correcting part. Then, when the sensed voltage values for all cell modules have been obtained, the accurate voltage for each cell module is calculated using the prescribed correction formula.

With the voltage sensing device disclosed in Japanese Kokai Patent Application No. 2001-264366, a constant must be obtained before the product is shipped in order to perform correction calculations based on a correction formula in the module voltage correcting part. That is, during preshipping checking, a reference voltage source is connected in place of the cell modules and its voltage sensed; the necessary constant is then calculated with a prescribed algorithm based on the sensed voltage value obtained. Therefore, much time is needed for preshipping checking, and there is also the problem of repeating the same procedure if a shipped device must be later replaced. There is also the problem of increased error due to changes over time if the constant obtained at the time of shipment continues to be used.

In addition, with the voltage sensing device shown in Japanese Kokai Patent Application No. 2001-264366, it is necessary to sense the voltage of each individual cell module. Because processing of a module voltage correcting part is relatively complicated, in Japanese Kokai Patent Application No. 2001-264366, it is realized with a microcomputer. Then, to obtain an accurate voltage value for each cell module, it is necessary to follow these steps: each sensed value of the cell modules undergoes analog-digital conversion, the obtained data are transmitted to the microcomputer, and correction calculations are executed based on the data transmitted to the microcomputer. That is, there is the problem that a large amount of time is required until voltage values are ascertained. Monitoring the cell module voltage to detect abnormalities, such as overvoltages, lead to the possibility that such a time delay may become a problem from the aspect of safety. The use of a microcomputer creates the problem of increased circuit area and power consumption.

SUMMARY OF THE INVENTION

The present invention was devised in consideration of this situation, and has as a general object to provide a voltage sensing device with which voltage can be sensed with high precision without obtaining a unique correction constant for each device.

The voltage sensing device pertaining to a first aspect of the present invention has multiple voltage input nodes, a pair of sensing input nodes, a first sensed signal generating part that holds sensing input nodes of said pair at a reference potential while also synthesizing the current input to said pair of sensing nodes at different ratios, and that generates a pair of first sensed signal according to said synthesized current, a switch part provided with multiple switches that turn on or off the connections between said multiple voltage sensing nodes and said pair of sensing input nodes, multiple input resistors, which have approximately equal resistance values, provided in the current paths between said multiple input nodes and said switch part, a control part that controls said switch part to select a pair of voltage input nodes from said multiple voltage input nodes and connect this selected pair of voltage input nodes and said pair of sensing input nodes with two types of patterns having different polarity, and a second sensed signal generating part that generates a second sensed signal according to the difference between said pair of first sensed signals generated by said first sensed signal generating part with said two types of connection patterns.

With said voltage sensing device, a pair of voltage input nodes may be selected by the switch part from the multiple voltage input nodes, and said pair of voltage input nodes selected is connected to said pair of sensing input nodes. Both sensing input nodes of said selected pair are held at said reference potential by said first sensed signal generating part, so that current corresponding to the voltage of said pair of voltage input nodes flows to the input resistors, with approximately equal voltage values, provided in the current paths between said pair of voltage input nodes and said switch part. The two currents are synthesized at different ratios by said first sensed signal generating part, and said first sensed signal is generated according to the synthesized current.

At the same time, said pair of voltage input nodes and said pair of sensing input nodes may be connected with two types of patterns with different polarity under the control of said control part, and the two first sensed signals generated in the two different connection patterns are input to said second sensed signal generating part. With said second sensed signal generating part, said second sensed signal, which represents the potential difference between said pair of voltage input nodes, is generated according to the difference between the two first sensed signals.

In this aspect of the invention, the voltages at said pair of sensing input nodes each produce "offset" from said reference potential due to the effect of the input offset voltage by said first sensed signal generating part. However, because said multiple input resistors have approximately equal resistance values, when "offset" relative to said reference potential occurs at one sensing input node, the error current component flowing to said input resistor due to the effect of the "offset" will be approximately equal, even when said input resistors in said two types of connection patterns are switched. The result is that the error current component included in said synthesized current in one connection pattern is approximately equal to the error current component included in said synthesized current in the other connection pattern. Therefore, with said second sensed signals generated according to the difference between said two first sensed signals generated in said two types of connection patterns, the error components due to the effect of said "offset" are approximately canceled, and approach zero.

On the other hand, with said first sensed signal generating part, because said two currents are synthesized at different ratios, the ratio of said two currents included in said synthesized current in one connection pattern and the ratio of said two currents included in said synthesized current in the other connection pattern are different. For this reason, even with error in said two synthesized currents in said two types of connection patterns, said two current components are not cancelled, and components corresponding to the error in said two currents remain. Therefore, said first sensed signal corresponds to the difference between said two currents, that is, corresponds to the difference between said pair of voltage input nodes.

In one aspect, said first sensed signal generating part has a first amplifying part that amplifies the difference between the voltage at one sensing input node and said reference voltage, a first resistor that connects the output node of said first amplifying part and said one sensing input node, a second amplifying part that amplifies the difference between the voltage at the other sensing input node and said reference voltage, a second resistor that connects the output node of said second amplifying part and said other sensing input node, and a third resistor that connects the output node of said first amplifying part and said other sensing input node.

In an aspect of the invention, said voltage sensing device may also have multiple sensing modules, each of which comprises said multiple input resistors, said switch part, said pair of sensing input nodes, and said first sensed signal generating part, and a selection part that selects one of said multiple sensing modules and inputs said first sensed signal generated by said first sensed signal generating part of said selected sensing module to said second sensed signal generating part.

In addition, said voltage sensing device may have a current supply part in a first checking node that supplies offset current to each of the current paths in which said multiple input resistors are provided, and a first determination part in said first checking node that determines whether there are abnormalities in said input resistors, based on the difference between said second sensed signal generated when said offset current is supplied, and said second sensed signal generated when said offset current is not supplied.

In this case, said input resistors may also comprise multiple resistors connected in series, and said current supply part may supply said offset current to inserted connection nodes between said serially connected multiple resistors.

Said multiple voltage input nodes may also comprise a pair of check nodes to which a reference voltage is input, and said control part in a second checking node may control said switch part to connect said pair of check nodes and said pair of sensing input nodes in two types of patterns with different polarity. Said voltage sensing device may also have a second determination part that determines whether there are abnormalities in said first sensed signal generating part, based on the difference between said second sensed signal generated in said second checking node and the reference value set according to said reference voltage.

In this case, there may also be an analog-digital conversion part that converts said first sensed signal and said reference voltage to digital data signals. Said second determination part may also judge whether there are errors in said first sensed signal generating part based on the difference between said second sensed signal generated according to the two digital data signals obtained by analog-digital conversion of the two said first sensed signals generated by said first sensed signal generating part in said second checking node, and said reference value corresponding to the digital data obtained by analog-digital conversion of said reference voltage.

The voltage sensing device pertaining to another aspect comprises multiple voltage input nodes, each of which is connected to the individual connection nodes of multiple cells connected in series, a switch circuit for selectively connecting two voltage input nodes, selected from said multiple voltage input nodes, and first and second nodes, multiple input resistors provided in each of the multiple current paths formed between said multiple voltage input nodes and said first and second nodes, and a voltage sensing circuit connected to said first and second nodes to sense the voltage difference appearing at said first and second nodes; wherein said voltage sensing circuit has a first operational amplifier part, the negative input terminal of which is connected to said first node and the positive input terminal of which is connected to a voltage supply terminal, a second operational amplifier, the negative input terminal of which is connected to said second node and the positive input terminal of which is connected to said voltage supply terminal, a first resistor connected between the output terminal and the negative input terminal of said first operational amplifier, a second resistor connected between the output terminal and the negative input terminal of said second operational amplifier, and a third resistor connected between the output terminal of said first operational amplifier and the negative input terminal of said second operational amplifier; when one of the two voltage input nodes selected from said multiple voltage input nodes and said first node are connected, and the other of said two selected input nodes and said second node are connected, said voltage sensing circuit outputs a first sensed voltage; when said other voltage input node and said first node are connected, and said one voltage input node and said second node are connected, said voltage sensing circuit outputs a second sensed voltage, and the voltage being applied to said two selected voltage input nodes is sensed based on the difference between said first sensed voltage and said second sensed voltage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
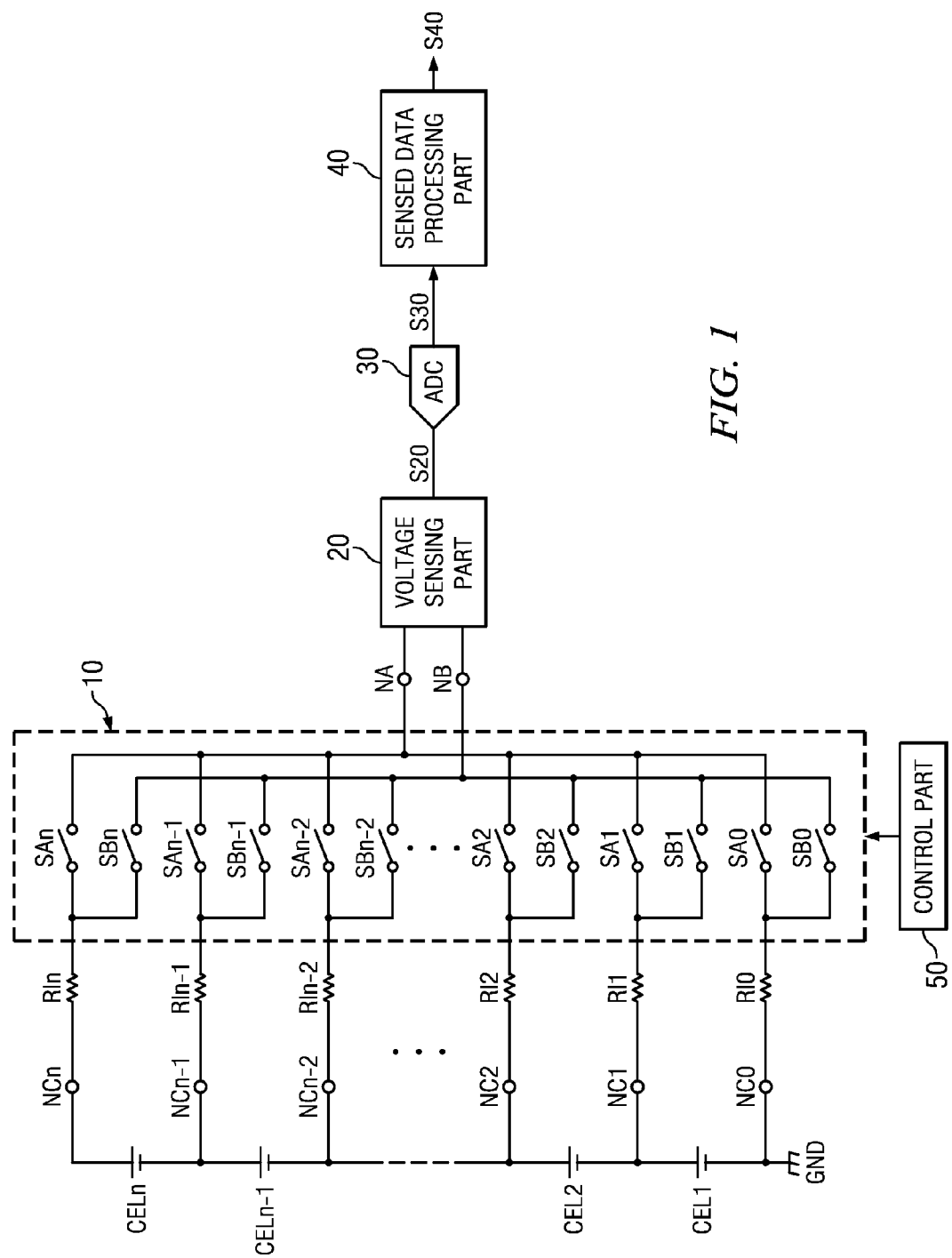
FIG. 1 shows an example of the configuration of a voltage sensing device pertaining to a first embodiment.

Referring now to the drawings wherein depicted elements are, for the sake of clarity, not necessarily shown to scale and wherein like or similar elements are designated by the same reference numeral through the several views.

In the FIGS., elements 10, 11-1, 11-2, 12, and 13 represent a switch part, 20, 20-1, 20-2 represent voltage sensing parts, 30 represents an analog-digital conversion part, 40 represents a sensed data processing part, 50, 51; 53 represent control parts, 61, 62 represent selection part, 70 represents a current supply part, A1, A2 represent operational amplifier circuits, CEL1-CELn represents a battery cell, 80, 100 represents a determination part, CM0-CMn represents a current source, M1-Mn represents a sensing module, NC0-NCn represents a voltage input node, NA, NB, NA1-NAn; NB1-NBn represents a sensing input node, Rf1, Rs2; Rf2 represent resistors, RI0-RIn, RV0, RV1 represents an input resistor, SA0-SAn, SB0-SBn represent switches.

With aspects of the present invention, it is possible to cancel error components caused by input offset voltage without acquiring a unique correction constant for each device, and high-precision voltage can be sensed.

First Embodiment

FIG. 1 shows an example of the configuration of a voltage sensing device pertaining to a first embodiment of the present invention. The voltage sensing device shown in FIG. 1 is a device that senses the voltage of each cell for battery cells CEL1-CELn connected in series, and has voltage input nodes NC0-NCn, input resistors RI0-RIn, a switch part 10, sensing input nodes NA, NB, a voltage sensing part 20, an analog-digital conversion part 30, a sensed data processing part 40, and a control part 50. Switch part 10 has switches SA0-SAn and SB0-SBn. Voltage input nodes NC0-NCn are one possible embodiment of the multiple voltage input nodes in the present invention. Sensing input nodes NA, NB are one possible embodiment of the two sensing input nodes in the present invention. Switch part 10 is one possible embodiment of the switch part in the present invention. Voltage sensing part 20 is one possible embodiment of the first sensed signal generating part in the present invention. Input resistors RI0-RIn are one possible embodiment of the input resistors in the present invention. Control part 50 is one possible embodiment of the control part in the present invention. Sensed data processing part 40 is one possible embodiment of the second sensed signal generating part in the present invention. The voltage at each terminal of battery cells CEL1-CELn connected in series is supplied to voltage input nodes NC0-NCn, respectively. The voltage at the negative terminal of cell CEL1 connected to ground potential GND is applied to voltage input node NC0, and for voltage input node NCk (k represents an integer 1 to n.) the voltage at the positive terminal of battery cell CELk is applied.

Switches SA0-SAn, SB0-SBn of switch part 10 turn on or off connections between voltage input nodes NC0-NCn and sensing input nodes NA, NB, based on control by control part 50. Switch SAj (j represents an integer 0 to n.) turns on or off the connection between voltage input node NCj and sensing input node NA, and switch SBj turns on or off the connection between voltage input node NCj and sensing input node NB. Input resistors RI0-RIn are provided in the current paths between voltage input nodes NC0-NCn and switch part 10. That is, input resistor RIj (j=0-n) are provided in the shared current paths between switches SAj and SBj and voltage input node NCj. Voltage sensing part 20 holds both sensing input nodes NA, NB at reference potential Vm, synthesizes the current input to sensing input nodes NA, NB at different ratios, and generates a sensed voltage signal S20 according to said synthesized current.

Figure 2:
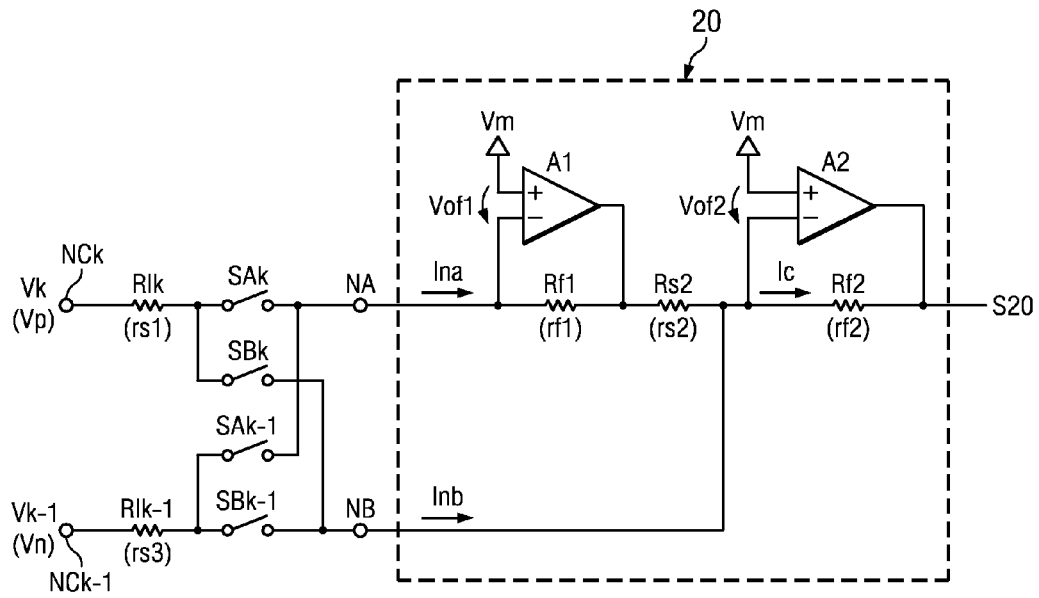
FIG. 2 shows an example of the configuration of a voltage sensing part.

FIG. 2 shows an example of the configuration of voltage sensing part 20. Voltage sensing part 20 shown in FIG. 2 has operational amplifier circuits A1 and A2, and resistors RF1, RS2, RF2. Operational amplifier circuit A1 is one possible embodiment of the first amplifying part in the present invention. Operational amplifier circuit A2 is one possible embodiment of the second amplifying part in the present invention. Resistor Rf1 is one possible embodiment of the first resistor in the present invention. Resistor Rf2 is one possible embodiment of the second resistor in the present invention. Resistor Rs2 is one possible embodiment of the third resistor in the present invention. The negative input node of operational amplifier circuit A1 is connected to sensing input node NA, the positive input node is connected to reference potential Vm, and the output node is connected to a negative input node through resistor Rf1. Resistor Rs2 connects the output node of operational amplifier circuit A1 and the negative input node of operational amplifier circuit A2. The negative input node of operational amplifier circuit A2 is connected to sensing input node NB, the positive input node is connected to reference potential Vm, and the output node is connected to a negative input node through resistor Rf2. Resistors Rf1, Rs2, Rf2 have the resistance values rf1, rs2, rf2, respectively.

Operation when current Ina is input to sensing input node NA and current Inb is input to sensing input node NB will be explained. Operational amplifier circuit A1 generates voltage at the output node to hold sensing input node NA at reference voltage Vm. When current Ina is input to sensing input node NA, operational amplifier circuit A1 generates voltage "−rf1 X Ina" relative to reference voltage Vm at the output node. On the other hand, operational amplifier circuit A2 also generates voltage at the output node to hold sensing input node NB at reference voltage Vm. Because sensing input node NB is held at reference voltage Vm, the potential difference "−rf1 X Ina" is applied to resistor Rs2. Therefore, current "−(rf1/rs2) X Ina" flows to resistor Rs2. This current and current Inb input to sensing input node NB are synthesized and flow to resistor Rf2. That is, current Ina and current Inb are synthesized at the ratio "−(rf1/rs2):1," and the synthesized current Ic flows to resistor Rf2. Operational amplifier circuit A2 generates voltage "−Ic×rf2" relative to reference voltage Vm, and outputs it as sensed voltage signal S20.

Explanation now returns to FIG. 1. Analog-digital conversion part 30 converts sensed voltage signal S20 output from voltage sensing part 20 to digital data S30 with a prescribed bit length. Control part 50 controls switch part 10 in voltage sensing part 20 to sense the voltage of each battery cell (CEL1-CELn). That is, control part 50 controls switch part 10 to select two voltage input nodes from voltage input nodes NC0-NCn, and connect said two selected voltage input nodes and sensing input nodes NA, NB in two types of patterns with different polarity. For example, when control part 50 selects voltage input nodes NCk, NCk-1 (k=1−n), two types of connections are provided, a pattern in which voltage input node NCk and sensing input node NA are connected, and voltage input node NCk-1 and sensing input node NB are connected (hereafter also referred to as "forward connection"), and a connection pattern in which voltage input node NCk and sensing input node NB are connected, and voltage input node NCk-1 and sensing input node NA are connected (hereafter also referred to as "reverse connection").

Sensed data processing part 40 generates sensed voltage data S40 that represents voltage at both ends of each battery cell (CEL1-CELn), based on digital data S30 output from analog-digital conversion part 30. That is, sensed data processing part 40 obtains two digital data S30 generated when the pair of voltage input nodes selected by control part 50 and sensing input nodes NA, NB are connected with said two types of patterns (forward connection, reverse connection), and generates sensed voltage data S40 representing the voltage input to said pair of voltage input nodes, according to the difference in the two digital data signals S30 obtained.

Here, the operation of a voltage sensing apparatus pertaining to this embodiment, which has the configuration described above, will be explained. Control part 50 selects one cell in sequence from the individual battery cells (CEL1-CELn), and connects a pair of voltage input nodes connected to the positive electrode of the selected cell and sensing input nodes NA, NB with two types of patterns (forward connection, reverse connection).

Figure 3A:
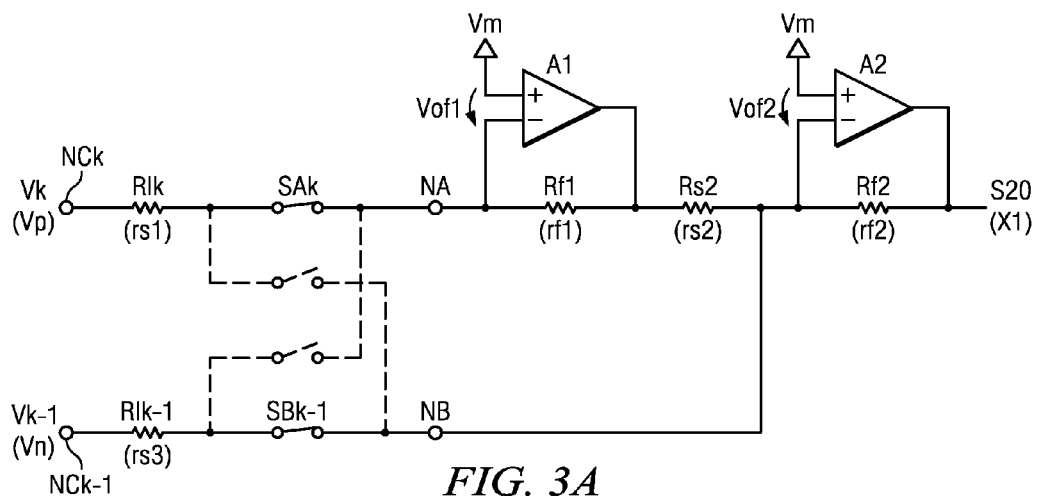
FIGS. 3(A) and 3(B) explain the two connection patterns when the pair of voltage input nodes and the pair of sensing input are connected.
Figure 3B:
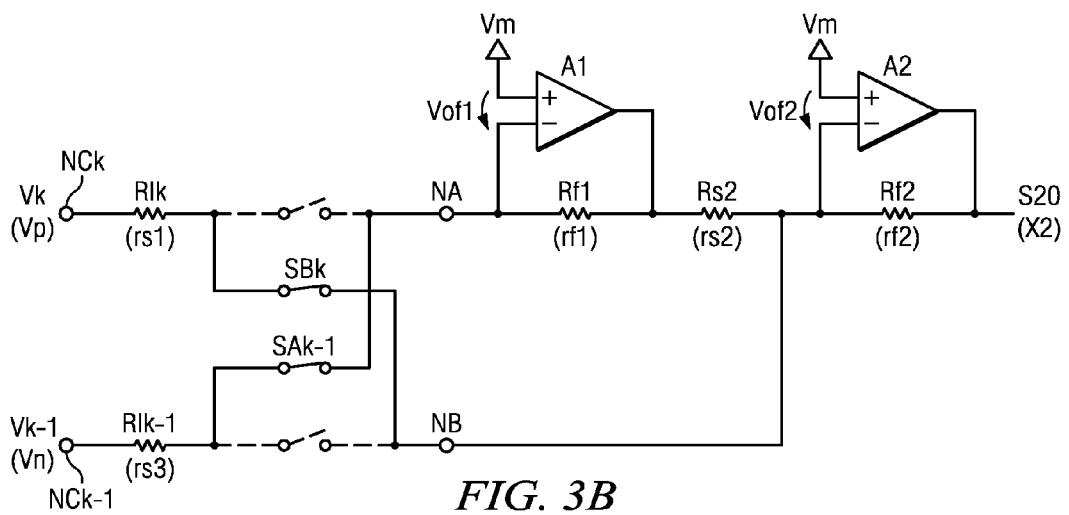

FIG. 3(A) shows a case in which voltage input nodes NCk, NCk-1 and sensing input nodes NA, NB are forward connected, and FIG. 3(B) shows a case in which they are reverse connected. As shown in FIGS. 3(A) and 3(B), control part 50 sets switches SAk, SBk-1 on and sets the other switches off in the forward connection, and sets switches SAk-1, Sbk on and the other switches off in the reverse connection.

In the following formulas, "X1" represents the voltage value of sensed voltage signal S20 with forward connection (FIG. 3(A)) and "X2" represents the voltage value of sensed voltage signal S20 with reverse connection (FIG. 3(B)). "X1" and "X2" are represented by the following formulas.

[Formula 1]

$$X1 = \frac{rf1 \cdot rf2}{rs1 \cdot rs2} \times Vp - \frac{rf2}{rs3} \times Vn - \frac{rf1 \cdot rf2}{rs1 \cdot rs2} \times Vof1 + \left(\frac{rf2}{rs2} + \frac{rf2}{rs3}\right) \times Vof2 \quad (1)$$

$$X2 = \frac{rf1 \cdot rf2}{rs1 \cdot rs2} \times Vn - \frac{rf2}{rs3} \times Vp - \frac{rf1 \cdot rf2}{rs3 \cdot rs2} \times Vof1 + \left(\frac{rf2}{rs2} + \frac{rf2}{rs1}\right) \times Vof2 \quad (2)$$

In formulas (1), (2), "Vp" represents the voltage at voltage input node Nck, "Vn" the voltage at voltage input node NCk-1, "rs1" the resistance value of input resistor RIk, "rs3" the resistance value of input resistor RIk-1, "Vof1" the input offset voltage of operational amplifier circuit A1, and "Vof2" the input offset voltage of operational amplifier circuit A2.

Sensed data processing part 40 obtains digital data (s30) for "X1," "X2" represented by formulas (1), (2), and calculates the difference between the two as sensed voltage data S40.

Assuming that resistance values rs1, rs3 of input resistors RIk, RIk-1 are equivalent, the difference "Xdif" between "X1" and "X2" is represented by the following formula.

[Formula 2]

$$Xdif = X1 - X2 = \left(\frac{rf1 \cdot rf2}{rs1 \cdot rs2} + \frac{rf2}{rs3}\right) \times (Vp - Vn) \quad (3)$$

As can be seen from formula (3), sensed voltage data S40 (Xdif) generated in sensed data processing part 40 includes no input offset voltage components in the third term or the fourth term on the right side of formulas (1) and (2), and the value of voltages (Vp-Vn) of the two voltage input nodes is multiplied by a fixed proportional constant.

As explained above, with the voltage sensing device pertaining to this embodiment, a pair of voltage input nodes NCk, NCk-1 is selected by switch part 10 from n voltage input nodes NC0-NCn, and the selected voltage input nodes NCk, NCk-1 are connected to sensing input nodes NA, NB. Input resistors RIk, RIk-1, that have approximately equal resistance values, are provided in the current path between voltage input nodes NCk, NCk-1 and switch part 10, and sensing input nodes NA, NB are held at reference potential Vm by voltage sensing part 20. For this reason, currents Ina, Inb corresponding to voltages Vp, Vn at voltage input nodes Nck, NCk-1 flow to input resistors RIk, RIk-1 (FIG. 2). Currents In1, Inb are synthesized at different ratios in voltage sensing part 20, and sensed voltage signal S20 corresponding to the synthesized current Ic is generated.

On the other hand, voltage input nodes NCk, NCk-1 and sensing input nodes NA, NB are connected with two types of patterns with different polarity (forward connection, reverse connection) under the control of control part 50, and the two sensed voltage signals S20 generated in the two connection patterns are input to sensed data processing part 40. With sensed data processing part 40, sensed voltage data S40 that represents the potential difference between voltage input nodes NCk and NCk-1 is generated according to the difference in the two sensed voltage signals S20.

Here, the voltage at sensing input nodes NA, NB produces offset from reference potential Vm due to the effect of input offset voltages Vof1, Vof2 of voltage sensing part 20. However, because input resistors RIk, RIk-1 have approximately equal resistance values, the error current component flowing to input resistor RIk due to the effect of input offset voltage Vof1 with forward connection, and the error current component flowing to input resistor RIk-1 due to the effect of input offset voltage Vof1 with reverse connection will be approximately equal. In the same way, the error current component flowing to input resistor RIk due to the effect of input offset voltage Vof2 with forward connection, and the error current component flowing to input resistor RIk-1 due to the effect of input offset voltage Vof2 with reverse connection will be approximately equal. The result is that the error component in the input offset voltage in synthesized current Ic with forward connection, and the error component in the input offset voltage in synthesized current Ic with reverse connection will be approximately equal. Therefore, with sensed voltage data S40 generated according to the difference between the two sensed voltage signals S20 obtained with forward connection and reverse connection, the error components in the input offset voltages are approximately canceled, and are extremely small.

On the other hand, with voltage sensing part 20, because currents Ina and Inb are synthesized at different ratios, the components of currents Ina and Inb in synthesized current Ic with forward connection and the components of currents Ina and Inb in synthesized current Ic with reverse connection are different, and when the difference between synthesized currents IC with forward connection and reverse connection is calculated, the error components in currents Ina and Inb are not canceled and, thus, remain. Therefore, sensed voltage data S40 is a signal corresponding to the difference between currents Ina and Inb, that is, a signal corresponding to the potential difference between voltage input nodes NCk and NCk-1.

Thus, with this embodiment, it is possible to realize high-precision voltage sensing without needing to obtain a unique correction constant for each device. For this reason, the amount of time spent in preshipping checking can be reduced, while the tedious work of calibration for replaced, shipped devices becomes unnecessary. No errors are produced by the correcting constant deviating from the appropriate value with changes in characteristics over time, so that voltage sensing precision can be improved, compared to conventional devices.

With this embodiment, too, with simple processing to obtain just two data signals with two connection patterns for the pair of voltage input nodes subject to sensing and to calculate the difference, the voltage at said pair of voltage input nodes can be sensed. Therefore, compared to conventional devices with which sensed values cannot be ascertained without sensing the voltage at each node, the time required for voltage sensing can be shortened significantly. The result is that, even when the voltage of each battery cell connected in series is monitored to judge abnormalities, such as overvoltages, determination results can be obtained sufficiently rapidly, and reliability can be improved.

In addition, with this embodiment, because voltage sensing results can be obtained with simple processing of calculating merely the difference between the two data signals, the device can be realized with a simple hardware configuration without using a microcomputer. The result is that circuit area and power consumption can be significantly reduced, compared to conventional devices.

Furthermore, with this embodiment, because input resistors RI0-RIn are provided in the current paths between voltage input nodes NC0-NCn and switch part 10, a drive signal based on reference potential Vm may be generated in control part 50 to drive all of the switches (SA0-SAn, SB0-SBn) of switch part 10.

Figure 4:
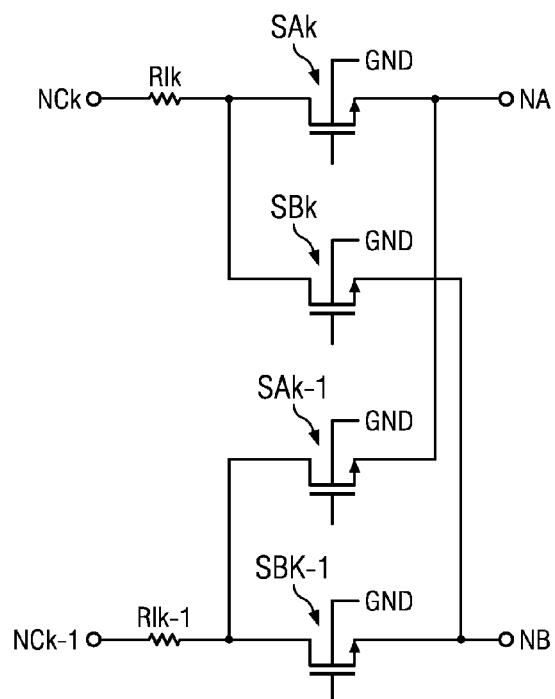
FIG. 4 shows an example in which all the switches of the switch part are constructed with NMOS transistors.

FIG. 4 shows an example in which switches (SA0-SAn, SB0-SBn) of switch part 10 are constructed with NMOS transistors. The NMOS transistors have a structure for high breakdown voltage called extended LOCOS offset drain. In this case, sources for the NMOS transistors constituting switches SA0-SAn, SB0-SBn are connected to sensing input nodes NA, NB, and drains are connected to one end of input resistors RI0-RIn.

The NMOS transistors have an appropriate drain breakdown voltage, relative to the voltage applied to voltage input nodes NC0-NCn. Sensing input nodes NA, NB are held at reference potential Vm, so that the level of the drive signals supplied to the gates of the NMOS transistors from control part 50 may be the same as the logical level of sensed data processing part 40, for example.

Thus, with this embodiment, because switch drive signals can be generated based on reference potential Vm, it is not necessary to provide an insulated power circuit for supplying power to the drive circuit of each switch, for example, and the circuit configuration can be simplified.

Second Embodiment

Figure 5:
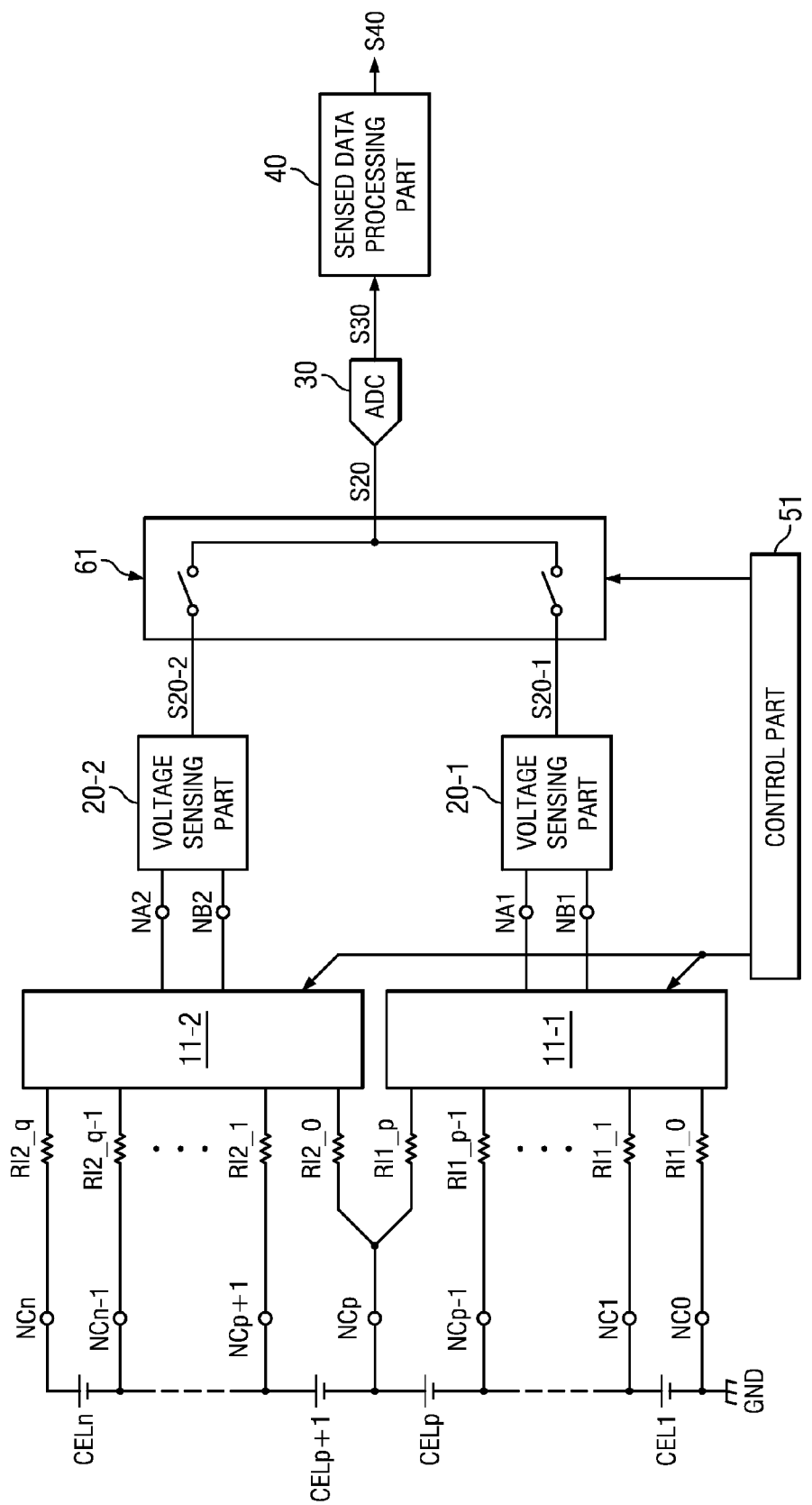
FIG. 5 shows an example of the configuration of a voltage sensing device pertaining to a second embodiment.

Next, a second embodiment of the present invention is explained. FIG. 5 shows an example of the configuration of a voltage sensing device pertaining to a second embodiment. The voltage sensing device showing in FIG. 5 has voltage input nodes NC0-NCn, input resistors RI1_0-RI1_p and RI2_0-RI2_q ("p," "q" represent integers that satisfy n=p+q.), switch parts 11-1 and 11-2, sensing input nodes NA1, NB1, NA2, NB2, voltage sensing parts 20-1 and 20-2, analog-digital conversion part 30, sensed data processing part 40, control part 51, and selection part 61. Here, the same symbols in FIG. 1 represent the same components in FIG. 5.

A unit comprising input resistors RI1_0-RI1_p, switch part 11-1, sensing input nodes NA1, NB1 and voltage sensing part 20-1, and a unit comprising input resistors RI2_0-RI2_9, switch part 11-2, sensing input nodes NA2, NB2 and voltage sensing part 20-2 are each one possible embodiment of a sensing module in the present invention. Control part 61 is one possible embodiment of the control part in the present invention.

Figure 6A:
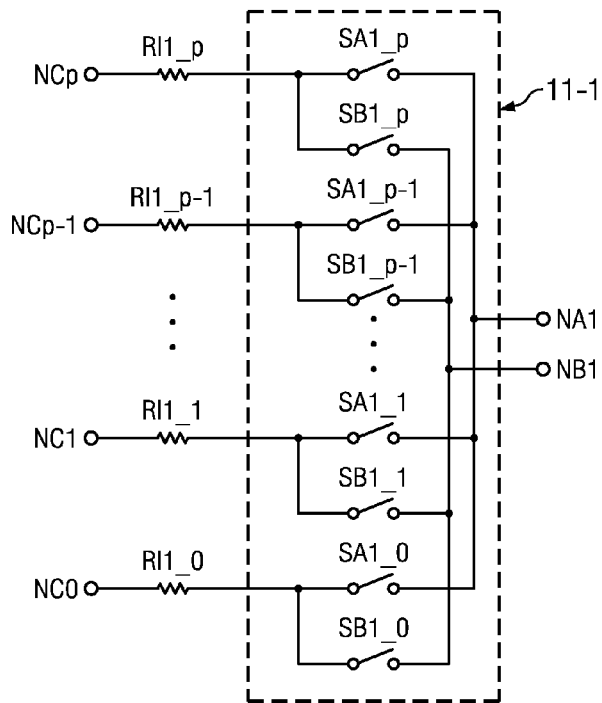
FIGS. 6(A) and 6(B) are an example of the configuration of a switch part in the voltage sensing device shown in FIG. 5.

Switch part 11-1 has p+1 switches that turn on or off the connections between voltage input nodes NC0-NCp and sensing input nodes NA1, NB1. For example, switch part 11-1 has switches SA1_0-SA1_p provided in p+1 current paths between sensing input node NA1 and voltage input nodes NC0-NCp, as shown in FIG. 6(A), and switches SB1_0-SB1_p provided in p+1 current paths between sensing input node NB1 and voltage input nodes NC0-NCp. Switch SA1_t (t represents an integer 0 to p.) turns on or off the connection between voltage input node NCt and sensing input node NA1, and switch SB1_t turns on or off the connection between voltage input node NCt and sensing input node NB1.

Input resistors RI1_0-RI1_p are provided in p+1 current paths between voltage input nodes NC0-NCp and switch part 11-1. In the example in FIG. 6(A), input resistor RI1_t (t=0-p) are provided in the shared paths between switches SA1_t and SB1_t and voltage input node Nct.

Figure 6B:
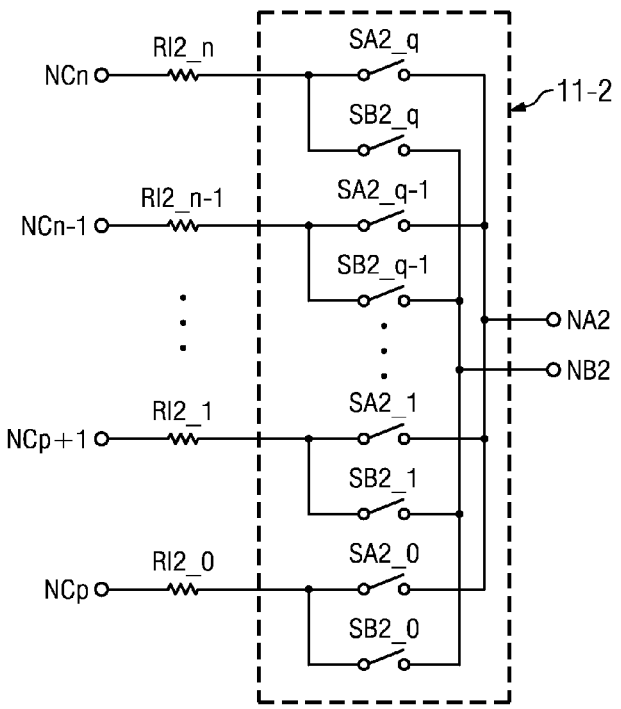

Switch part 11-2 is provided with Q+1 switches that turn on or off the connections between voltage input nodes NCp-NCn (n=p+q) and sensing input nodes NA2, NB2. For example, switch part 11-2 has switches SA2_0-SA2_q provided in q+1 current paths between sensing input node NA2 and voltage input nodes NCp-NCn, and switches SB2_0-SB2_q provided in q+1 current paths between sensing input node NB2 and voltage input nodes NCq-NCn, as shown in FIG. 6(B). Switch SA2_u (u represents an integer 0 to q.) turns on or off the connection between voltage input node NCp+u and sensing input node NA2, and switch SB2_u turns the connection between voltage input node NCp+u and sensing input node NB2 on or off.

Input resistors RI2_0-RI2_q are provided in q+1 current paths between voltage input nodes NCq-NCn and switch part 11-2. In the example in FIG. 6(B), input resistors RI2_u (u=0-q) are provided in the shared current paths between switches SA1_u and SB1_u and voltage input node NCp+u.

Each switch of switch parts 1-1, 11-2, as shown in FIG. 4, can be constructed with an NMOS transistor. In this case, the source of the NMOS transistors is connected to the sensing input nodes (NA1, NB1, NA2, NB2), and the drain is connected to one end of the input resistors (RI1_0-RI1_p, RI2_0-RI2_q).

Voltage sensing part 20-1 holds both sensing input nodes NA1, NB1 at reference potential Vm, and also synthesizes the current input to sensing input nodes NA1, NB1 at different ratios to generate sensed voltage signal S20-1 according to said synthesized current.

Voltage sensing part 20-2 holds both sensing input nodes NA2, NB2 at reference potential Vm and also synthesizes the current input to sensing input nodes NA2, NB2 at different ratios to generate sensed voltage signal S20-2 corresponding to said synthesized current.

Voltage sensing parts 20-1, 20-2 has the same configuration as voltage sensing part 20 shown in FIG. 2, for example. Selection part 61 selects either the sensed voltage signal S20-1 generated by voltage sensing part 20-1 or the sensed voltage signal S20-2 generated by voltage sensing part 20-2, and inputs said selection result to analog-digital conversion part 30 as sensed voltage signal S20. Control part 51 controls switch part 11-1 so that the voltages of battery cells CEL1-CELp are sensed by voltage sensing part 20-1, and also controls switch part 11-2 so that the voltage of battery cells CELp-CELn are sensed by voltage sensing part 20-2.

The controlling of switch parts 11-1 and 11-2 is the same as the controlling of switch part 10 by control part 50 explained previously. That is, control part 51 controls switch part 11-1 to select two voltage input nodes from voltage input nodes NC0-NCq and connect said two selected voltage input nodes and sensing input nodes NA1, NB1 in two types of patterns with different polarity (forward connection, reverse connection). Control part 51 also controls switch part 11-2 to select two voltage input nodes from voltage input nodes NCq-NCn and connect said two selected voltage input nodes and sensing input nodes NA2, NB2 with two types of patterns with different polarity (forward connection, reverse connection).

In addition, control part 51 controls selection of the sensed voltage signal in selection part 61 so that a sensed voltage signal (S20-1 or S20-2) for each battery cell (CEL1-CELn) will be converted to digital data S30 by analog-digital conversion part 30.

For analog-digital conversion part 30 and sensed data processing part 40, the components have the same symbols as in FIG. 1, therefore an explanation is omitted.

Here, the operation of the voltage sensing device in FIG. 5 is explained. Control part 51 selects either sensed voltage signal S20-1 or S20-2 with selection part 61. When sensed voltage signal S20-1 is selected, control part 51 selects one battery cell successively from battery cells CEL1-CELp, and connects the pair of voltage input nodes connected to the positive electrode of the selected battery cell and sensing input nodes NA1, NB1 in two types of patterns (forward connection reverse connection). On the other hand, when sensed voltage signal S20-2 is selected, control part 51 selects one battery cell successively from battery cells CELp+1-CELn, and connects the pair of voltage input nodes connected to the positive electrode of the selected battery cell and sensing input nodes NA2, NB2 with two types of patterns (forward connection, reverse connection)

Sensed data processing part 40 obtains each digital data signal S30 for sensed voltage signal S20-1 generated with the two types of connection patterns each time a battery cell is selected under the control of control part 51, and calculates the difference between the digital data S30 obtained as sensed voltage data S40 for the relevant battery cell.

In the voltage sensing device pertaining to this embodiment, too, because high-precision sensed voltage data S40 in which error components caused by the input bias voltage for the voltage sensing parts (20-1, 20-2) have been canceled in the same way as the voltage sensing device shown in FIG. 1 described previously, the same effects as the voltage sensing device shown in FIG. 1 are achieved.

With the voltage sensing device shown in FIG. 5, too, multiple groups of circuits comprising one voltage sensing part and input resistors and switches connected to it (hereafter sometimes referred to as "sensing module") are provided, and because the current paths from the voltage sensing nodes to the voltage sensing part are divided for each sensing module, the resistance values of the input resistors can be set to a different value for each sensing module. For example, for a battery cell with lower potential difference relative to reference potential Vm, the resistance value of the input resistor connected to it can be set lower. Thus, with a sensing module in which the resistance value is lowered, the current flowing to the input resistor increases, and the speed at which a sensed voltage signal is generated in the voltage sensing part is improved, so that voltage sensing time can be shortened.

In addition, by providing multiple sensing modules, it is possible to moderate the delay time in generating sensed voltage signals caused by switching by the switch part. For example, selection part 61 will switch the sensing module each time one sensed voltage signal (S20-1, S20-2) or one sensed voltage data S40 is generated for a pair of voltage input nodes. Then, control part 51 controls the switch part (11-1, 11-2) of the relevant sensing module so that connection of the pair of voltage input nodes and the pair of sensing input nodes is completed before switching is performed by selection part 61. That is, switching of the switch parts (11-1, 11-2) in the relevant sensing module is completed before switching to the next sensing module by selection part 61, and the start time for generating sensed voltage signals (S20-1, S20-2) by the voltage sensing parts (20-1, 20-2) is accelerated. The sensed voltage signals (S20-1, S20-2) in the voltage sensing parts (20-1, 20-2) rise earlier, and the conversion wait time provided for stabilization of the input signal (S20) in analog-digital conversion part 30 can be shortened, so that the time required to obtain sensed voltage data S40 can be shortened.

Third Embodiment

Figure 7:
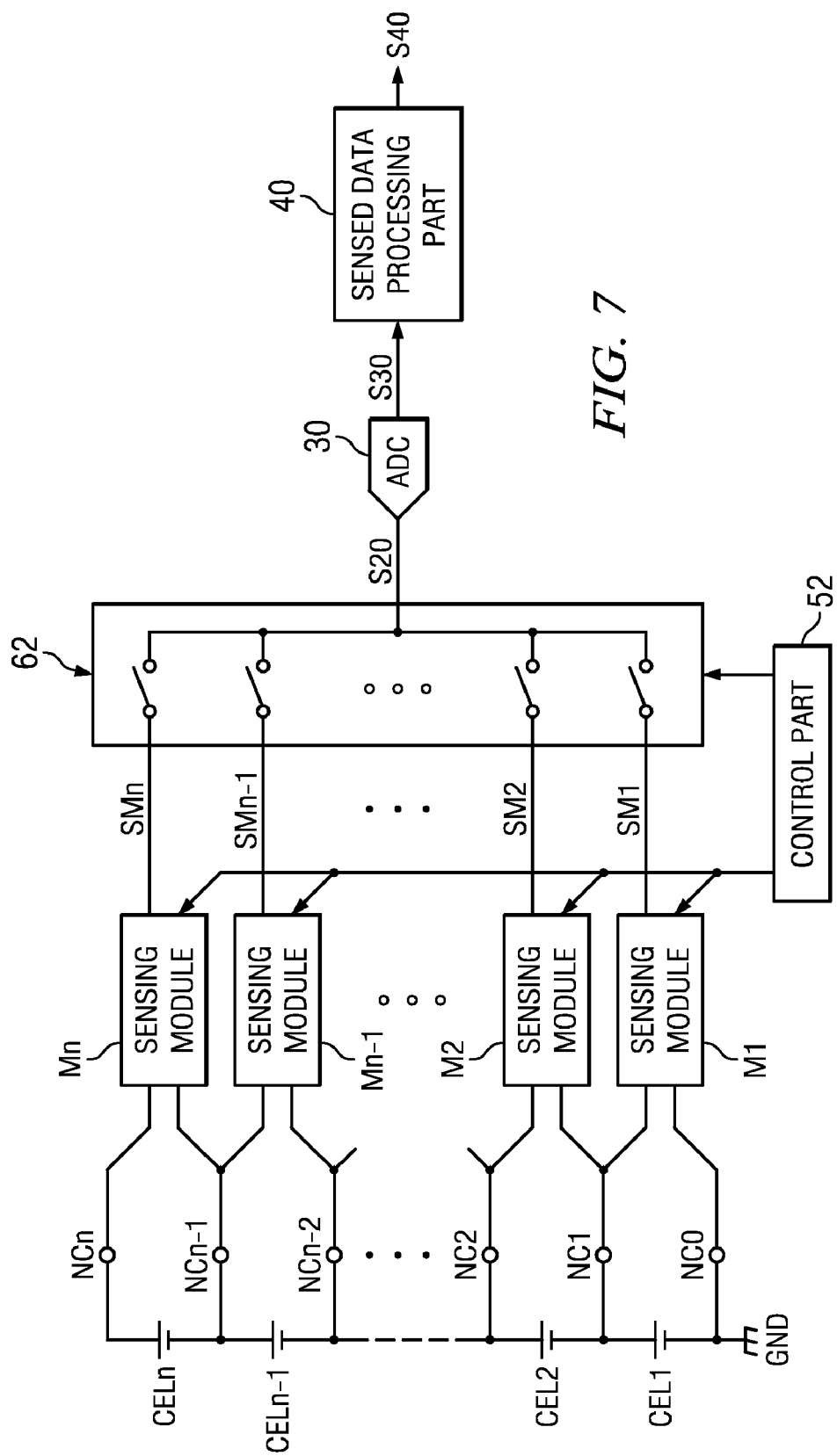
FIG. 7 shows an example of the configuration of a voltage sensing device pertaining to a third embodiment.

Next, a third embodiment of the present invention is explained. FIG. 7 shows an example of the configuration of a voltage sensing device pertaining to a third embodiment. The voltage sensing device shown in FIG. 7 has voltage input nodes NC0-NCn, sensing modules M1-Mn, selection part 62, analog-digital conversion part 30, sensed data processing part 40, and control part 52. Here, the symbols in FIG. 1 and FIG. 7 represent the same components. Sensing modules M1-Mn are each one possible embodiment of a sensing module in the present invention. Selection part 62 is one possible embodiment of the control part in the present invention.

Figure 8:
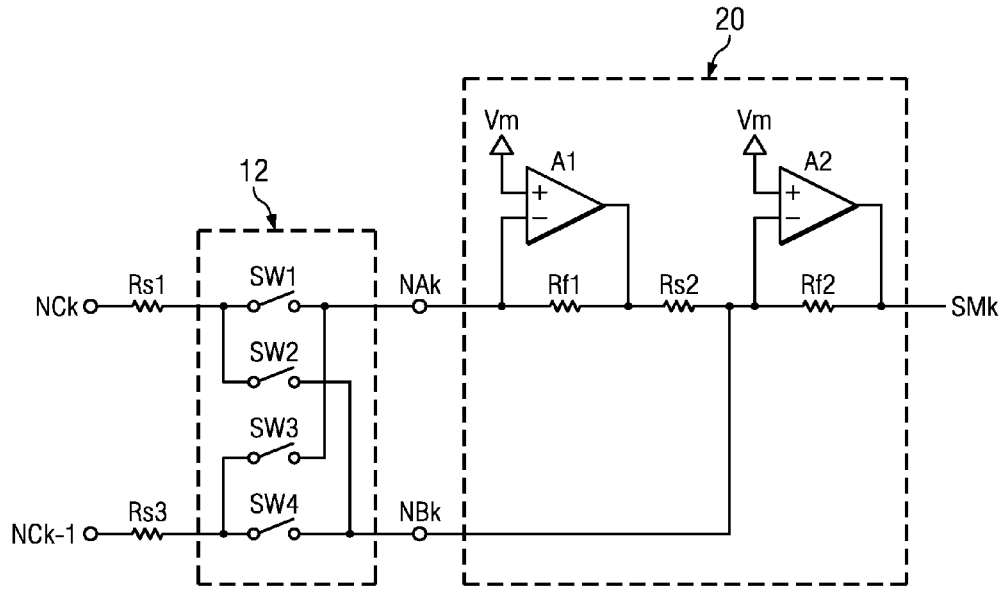
FIG. 8 shows an example of the configuration of a sensing module in the voltage sensing device shown in FIG. 7.

Sensing module Mk (k=1-n) is a circuit that generates a sensed voltage signal SMk according to the voltage at a battery cell CELk which is applied to a pair of voltage input nodes NCk and NCk-1, and has, for example, input resistors Rs1 and Rs3, switch part 12, a pair of sensing input nodes NAk and NAk-1, and voltage sensing part 20, as shown in FIG. 8.

Switch part 12 is provided with four switches SW1-SW4 that turn on or off the connections between the pair of voltage input nodes NCk and NCk-1 and the pair of sensing input nodes NAk and NBk. Switch SW1 turns on or off the connection between voltage input node NCk and sensing input node NAk, switch SW2 turns on or off the connection between voltage input node NCk and sensing input node NBk, switch SW3 turns on or off the connection between voltage input node NCk-1 and sensing input node NAk, and switch SW4 turns on or off the connection between voltage input node NCk-1 and sensing input node NBk.

Input resistor Rs1 is provided in the shared current path between switches SW1, SW2 and voltage input node NCk. Input resistor Rs2 is provided in the shared current path between switches SW3, SW4 and voltage input node NCk-1.

Voltage sensing part 20 has the same configuration as the voltage sensing part with the same symbol shown in FIG. 2 and generates sensed voltage signal SMk according to the synthesized current for the current input to sensing input nodes NAk and NAk-1.

Selection part 62 selects one sensing module from sensing modules M1-Mn, and inputs the sensed voltage signal generated by said selected sensing module to analog-digital conversion part 30.

Control part 52 controls selection part 62 so that one sensing module is selected successively from sensing modules M1-Mn. Then, in the sensing module selected by selection part 62, switch part 12 of said sensing module is controlled so that the pair of voltage input nodes and the pair of sensing input nodes are connected with two types of patterns with different polarity (forward connection reverse connection).

In the voltage sensing device pertaining to this embodiment, too, because sensed signals are generated by forward connection and reverse connection in each sensing module (M1-Mn), in the same way as with the voltage sensing device shown in FIG. 1 described previously, it is possible to obtain high-precision sensed voltage data S40 in the sensed data processing part 40, and the same effects as the voltage sensing device shown in FIG. 1 are achieved.

Voltage sensing time can also be shortened using the same method as the voltage sensing device shown in FIG. 5 by providing multiple sensing modules.

Fourth Embodiment

Next, a fourth embodiment of the present invention is explained. The voltage sensing device pertaining to this embodiment is provided with a check node relating to the input resistors.

Figure 9:
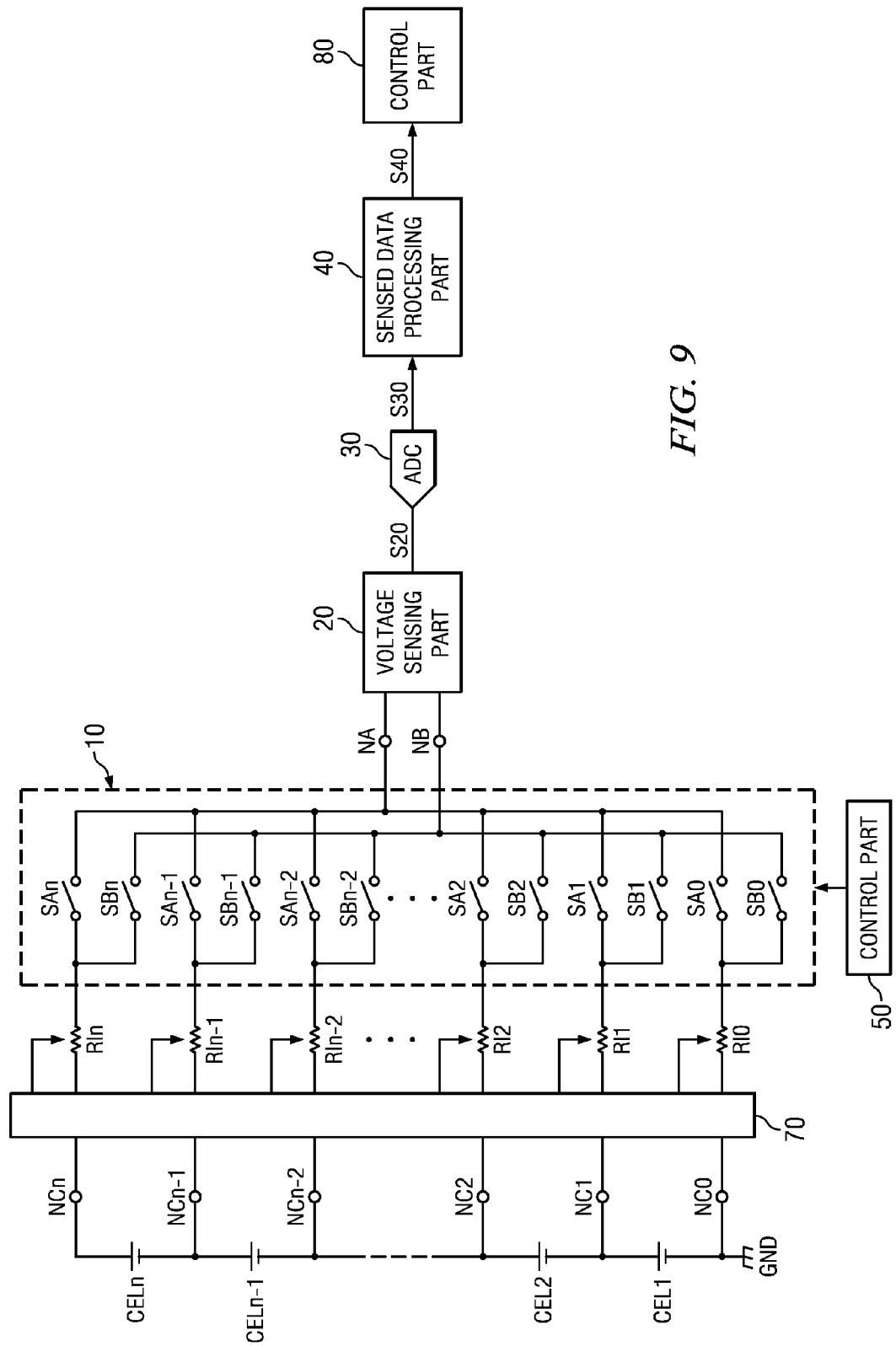
FIG. 9 shows an example of the configuration of a voltage sensing device pertaining to a fourth embodiment.

FIG. 9 shows an example of the configuration of a voltage sensing device pertaining to a fourth embodiment. The voltage sensing device shown in FIG. 9 has the same configuration as the voltage sensing device shown in FIG. 1, and also has a current supply part 70 and a determination part 80. Current supply part 70 is one possible embodiment of the current supply part in the present invention. Determination part 80 is one possible embodiment of the first determination part in the present invention. Current supply part 70 supplies offset current to each of n+1 current paths in which input resistors RI0-RIn are provided in a checking node in which input resistors RI0-RIn are checked (first checking node). For example, current supply part 70 has n+1 current sources CM0-CMn that supply offset current to said n+1 current paths. Current source CMj (j=0-n) supplies offset current to the current path in which input resistor RIj is provided.

Figure 10:
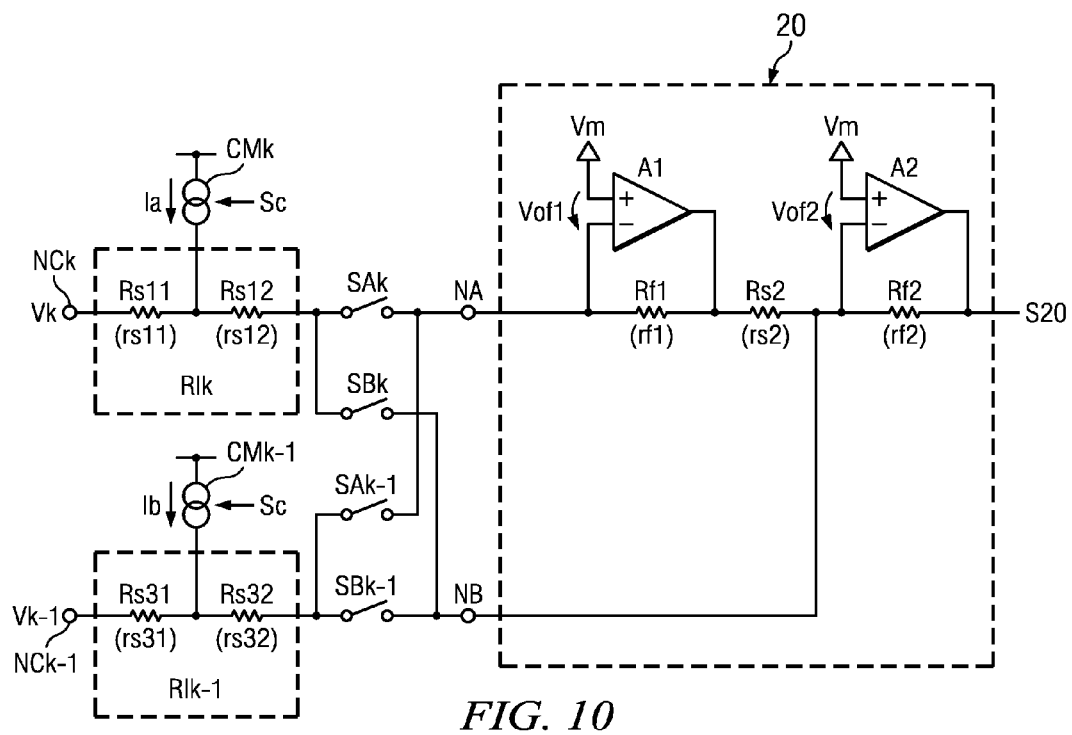
FIG. 10 shows an example of the configuration of the current supply part in the voltage sensing device shown in FIG. 9.

Each input resistor (RI0-RIn) is configured with two resistors connected in series as shown in FIG. 10, for example, and the offset current from current sources (CM0-CMn) is supplied to inserted connection nodes of the resistors connected in series.

In the example in FIG. 10, input resistor RIk (k=1-n) comprises resistors Rs11 and Rs12 connected in series. Resistor Rs11 is connected to voltage input node NCk, and resistor Rs12 is connected to switches SAk, SBk of switch part 10. Offset current Ia from current source CMk is supplied to an inserted connection node between resistors Rs11 and RS12.

On the other hand, input resistor RIk-1 comprises resistors Rs31 and Rs32 connected in series. Resistor Rs31 is connected to voltage input node NCk-1, and resistor Rs32 is connected to switches SAk-1, SBk-1 of switch part 10. Offset current Ib from current source CMk-1 is supplied to an inserted connection node between resistors Rs31 and Rs32.

Figure 11A:
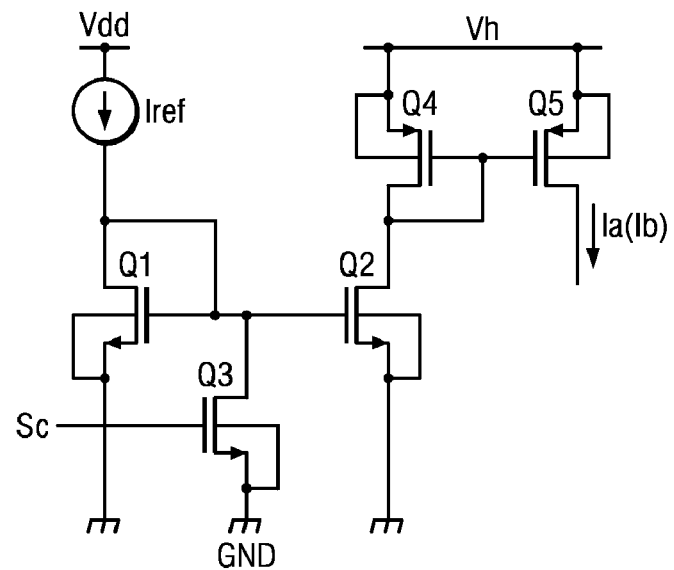
FIGS. 11(A) and 11(B) show an example of the configuration of a current source provided with a current supply part.
Figure 11B:
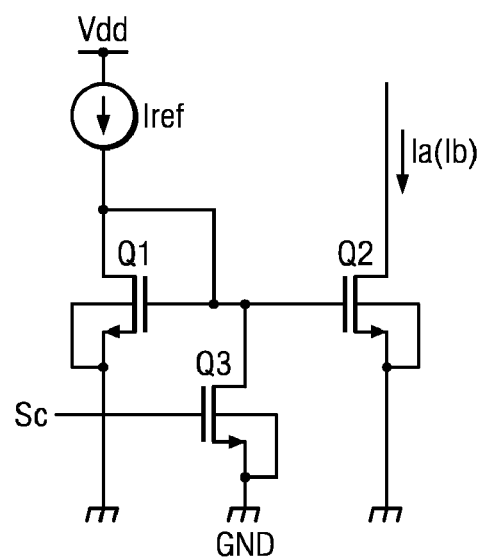

FIGS. 11(A) and 11(B) show an example of the configuration of current source CMj of current supply part 70.

FIG. 11(A) shows the configuration of current source CMj when current enters from the high potential side. Current source CMj shown in FIG. 11(A) has NMOS transistors Q1 and Q2 that constitute a current mirror circuit on the ground potential GND side, PMOS transistors Q4 and Q5 that constitute a current mirror circuit on the potential Vh side, which is higher than ground potential GND, and NMOS transistor Q3 for turning offset current on or off.

The gate and drain of MOS transistor Q1 are connected, the source is connected to ground potential GND, and reference current Iref is input to the drain. The gate of MOS transistor Q2 is connected to the gate of MOS transistor Q1, the source is connected to ground potential GND, and the drain is connected to the drain of MOS transistor Q4. The gate and drain of MOS transistor Q4 are connected, the source is connected to potential Vh, and drain current is output to the drain of MOS transistor Q2. The gate of MOS transistor Q5 is connected to the gate of MOS transistor Q4, the source is connected to potential Vh, and offset current Ia (Ib) is output from the drain. MOS transistor Q3 is between the gate of MOS transistor Q2 and ground potential GND, and is turned on or off according to control signal Sc input to the gate.

With current source CMj shown in FIG. 11(A), the generation of offset current Ia (Ib) is controlled by turning MOS transistor Q3 on or off.

When MOS transistor Q3 is off, reference current Iref flows to MOS transistor Q1, and current proportional to reference current Iref also flows to MOS transistor Q2, to which the same gate voltage as MOS transistor Q1 is input. The same drain voltage as MOS transistor Q2 flows to MOS transistor Q4. Current proportional to the drain current from MOS transistor Q4 also flows to MOS transistor Q5, to which the same gate voltage as MOS transistor Q4 is input, and it is output as offset current Ia (Ib). Therefore, current source Cmj sends current proportional to reference voltage Iref to the input resistors from the high potential side.

When MOS transistor Q3 is on, the gates and sources of MOS transistors Q1 and Q2 short-circuit, current in transistors Q1 and Q2 is zero, and the current in MOS transistors Q4 and Q5 is also zero because of this. Therefore, no offset current Ia (Ib) will flow from current source CMj.

Potential Vh to which current source CMj shown in FIG. 11(A) is connected may be appropriately high potential from the node into which offset current is supplied, and the anode of battery cell CELj, or the terminal of a battery cell with even higher potential than the cathode, may be used as potential Vh, for example.

On the other hand, FIG. 11(B) shows the configuration of current source CMj when current is drawn to the ground potential GND side. In current source CMj shown in FIG. 11(B), the current mirror circuit (MOS transistors Q4 and Q5) on the high potential side in the circuit shown in FIG. 11(A) is omitted, and the drain current from MOS transistor Q2 is offset current Ia (Ib).

The above is an explanation of current supply part 70. Determination part 80 determines whether there are abnormalities at the input resistors (RI0-RIn), based on the difference between sensed voltage data S40 generated when current supply is on with current supply part 70, and sensed voltage data 40 generated when said current supply is off, in a first checking node. That is, determination part 80 determines whether there are abnormalities at the input resistors (RI0-RIn), based on the difference between sensed voltage data S40 when offset current Ia, Ib is supplied, and sensed voltage data S40 generated when no offset current Ia, Ib is supplied.

Sensed voltage data S40 obtained according to the difference between sensed voltage signal S20 output with forward connection and sensed voltage signal S20 output with reverse connection, when offset current Ia and Ib are supplied to input resistors RIk and RIk-1, respectively, in the first checking node is "Xchk." When the difference between sensed voltage data "Xchk" obtained in the first checking node, and sensed voltage data "Xdif" obtained in normal node is found (formula (3)) and the absolute value used as error "E1," error "E1" is represented by the following formula.

[Formula 3]

$$E1 = |Xchk - Xdif| = \left| \begin{array}{l} \left( \frac{rf1 \cdot rf2}{rs1 \cdot rs2} + \frac{rf2}{rs1} \right) \times rs11 - 1a - \\ \left( \frac{rf1 \cdot rf2}{rs3 \cdot rs2} + \frac{rf2}{rs3} \right) \times rs31 - 1b \end{array} \right| \quad (4)$$

$$rs1 = rs3, rs11 = rs31 \rightarrow E1|Xchk - Xdif| = 0 \quad (5)$$

In Formula (4), "rs11" represents the resistance value of resistor Rs11, "Rs12" the resistance value of resistor RS12, "rs31" the resistance value of resistor Rs31, and "rs32" the resistance value of resistor Rs32, respectively.

Here, assuming that offset currents Ia and Ib are equal, the resistance values of resistors Rs1 (Rs11, Rs12) and Rs2 (Rs31, Rs32) are equal, and the resistance dividing ratios in input resistors RIk and RIk-1 are equal (that is, "rs11" and "rs13" are equal, error E1 is zero (formula (5))).

Therefore, determination part 80 determines that there is an abnormality in one or both of input resistors RIk and RIk-1 when error E1 is larger than a prescribed reference value, for example.

As explained above, with this embodiment, because checking as to whether there are abnormalities in input resistors RI0-RIn can be performed at any time, even after the product is shipped, the reliability of voltage checking results can be improved. When there is determined to be overvoltage in a battery cell based on the voltage sensing result, because determination reliability is improved, the reliability and safety of devices in which the battery cells are incorporated can be increased.

Fifth Embodiment

Next, a fifth embodiment of the present invention is explained. The voltage sensing device pertaining to this embodiment is provided with a checking node relating to the voltage sensing part.

Figure 12:
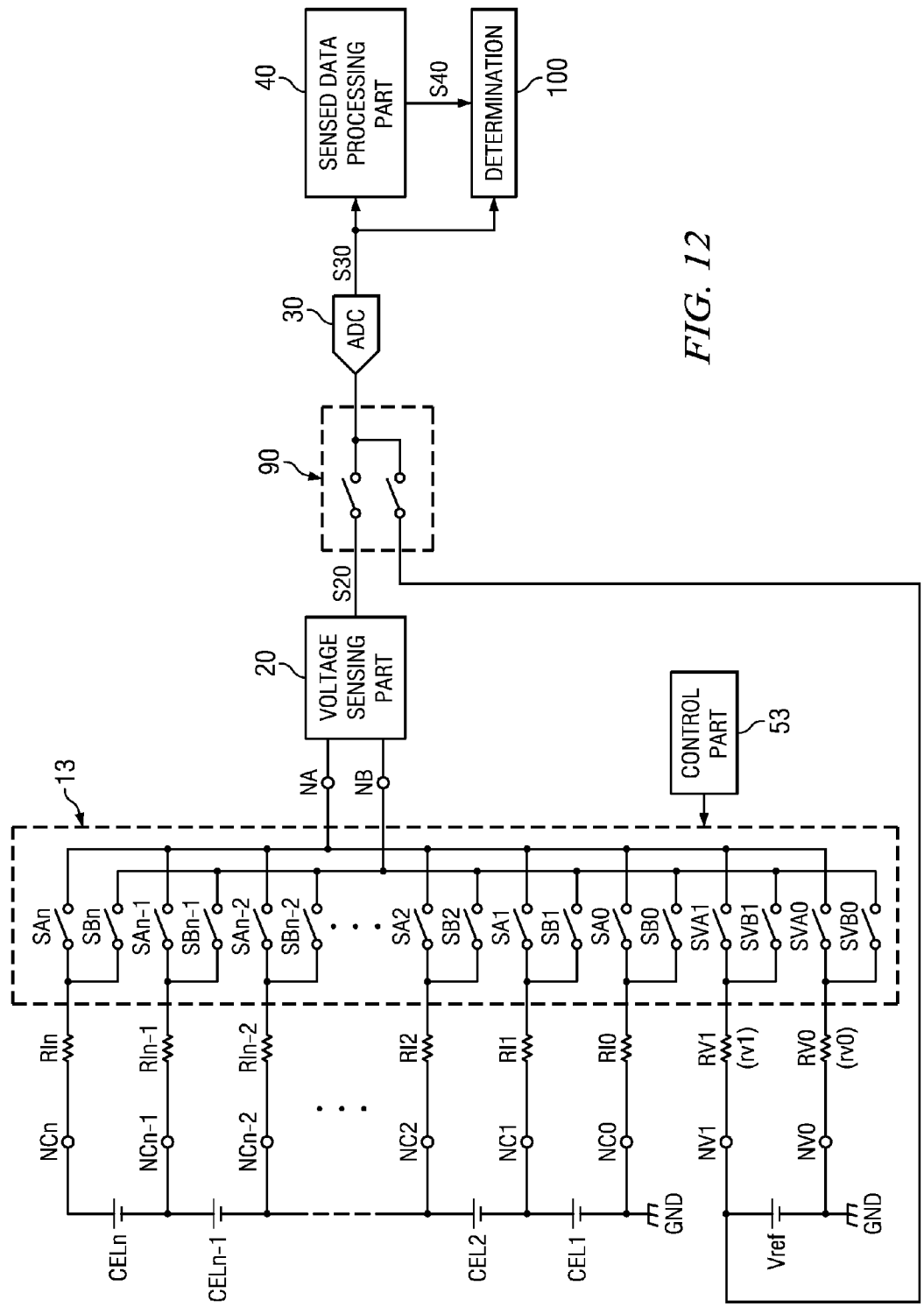
FIG. 12 shows an example of the configuration of a voltage sensing device pertaining to a fifth embodiment.

FIG. 12 shows an example of the configuration of a voltage sensing device pertaining to a fifth embodiment. In the voltage sensing device shown in FIG. 12, switch part 10 in the voltage sensing device shown in FIG. 1 is replaced with a switch part 13, control part 50 is replaced with a control part 53, and check nodes NV0 and NV1 to which reference voltage Vref is input, input resistors RV0 and RV1, selection part 90, and determination part 100 are provided. The other components are the same as in the voltage sensing device shown in FIG. 1. Check nodes NV0 and NV1 are one possible embodiment of the pair of check nodes in the present invention. Determination part 100 is one possible embodiment of the second determination part in the present invention.

In switch part 13, checking switches SVA0, SVA1, SVB0 and SVB1 are added to switch part 10 in FIG. 1. Switch SVA1 turns on or off the connection between check node NV1 and sensing input node NA, Switch SVB1 turns on or off the connection between check node NV1 and sensing input node NB, Switch VA0 turns on or off the connection between check node NV0 and sensing input node NA, and switch SVB0 turns on or off the connection between check node NV0 and checking input node NB.

Control part 53 controls switches SA0-SAn and SB0-SBn the same way as control part 50 in FIG. 1 in normal mode, and controls switches SVA0, SVA1, SVB0 and SVB1 in a checking node in which voltage sensing part 20 is checked (second checking node). That is, control part 53, in the second checking node, controls switches SVA0, SVA1, SVB0 and SVB1 to connect check nodes NV0 and NV1 and sensing input nodes NA and NB in two types of patterns with different polarity (forward connection, reverse connection).

Selection part 90 selects sensed voltage signal S20 generated in voltage sensing part 20 or one reference voltage Vref input to sensing nodes NV0 and NV1, and inputs it to analog-digital conversion part 30.

Determination part 100, in the second checking node, determines whether there are abnormalities in voltage sensing part 30 based on the difference between sensed voltage data S40 generated based on the two sensed voltage signals S20 output from voltage sensing part 20 and the reference value based on reference voltage Vref. That is, determination part 100, in the second checking node, determines whether there is an abnormality in voltage sensing part 30, based on the difference between sensed voltage data S40, which corresponds to reference voltage Vref sensed using voltage sensing part 20, and the reference value corresponding to digital data S30 in which reference voltage Vref has been directly converted by analog-digital conversion part 30.

In the second checking node, check nodes NV0 and NV1 and sensing input nodes NA and NB are connected in two types of patterns with different polarity (forward connect, reverse connection), and when sensed voltage data S40 obtained according to the difference between sensed voltage signals S20 generated in the two types of patterns is "Xvrf," "Xvrf" is represented as in the following formula.

[Formula 4]

$$Xvrf = \left(\frac{rf1 \cdot rf2}{rv1 \cdot rs2} + \frac{rf2}{rv0}\right) \times Vref = G \times Vref \quad (6)$$

$$G = \frac{rf1 \cdot rf2}{rv1 \cdot rs2} + \frac{rf2}{rv0} \quad (7)$$

In formulas (6) and (7), "rv0" represents the resistance value of resistor RV0, "rv1" the resistance value of resistor RV1, and "G" the voltage gain, respectively. The other symbols are the same as in formula (3).

The difference between "Xvrf" divided by voltage gain G and reference voltage Vref is found and the absolute value thereof used as error "E2"; "E2" is represented below.

[Formula 5]

$$E2 = \left|\frac{Xvrf}{G} - Vref\right| = 0 \quad (8)$$

As shown in formula (8), error "E2" ideally is zero. Therefore, determination part 100 determines that there is an abnormality in voltage sensing part 20 when error "E2" is larger than a prescribed upper limit.

As explained above, with this embodiment, because checking as to whether there are abnormalities in voltage sensing part 20 can be performed at any time, even after the product is shipped, the reliability of voltage checking results can be improved. When there is determined to be overvoltage in a battery cell based on the voltage sensing result, because determination reliability is improved, the reliability and safety of devices in which the battery cells are incorporated can be increased.

In addition, reference voltage Vref is converted to digital data (S30) by analog-digital conversion part 30, and whether there are abnormalities in voltage sensing part 20 is determined based on the difference between a reference value set according to the digital data and sensed voltage data S40 generated according to two sensed voltage signals S20 where reference voltage Vref is sensed by voltage sensing part 20. So even when the level of reference voltage Vref changes over time, there is little change in the relative difference between the reference value and sensed voltage data S40, and a lowering of determination precision is prevented. Therefore, voltage checking part 20 can be safely inspected after the product is shipped.

Note that if the resistance values of input resistors RV0 and RV1 are set so that voltage gain G shown in formula (7) is "1," the calculation of "Xref" and voltage gain G as shown in formula (8) can be omitted, so that determination processing by determination part 100 can be further simplified.

Several embodiments of the present invention were explained above, but the present invention is not limited only to the abovementioned embodiments and encompasses many variations without departing from the spirit and scope of the invention as defined by the appended claims.

With the abovementioned embodiments, an example was given where the voltage of each cell is sensed, but the present invention is not limited to this. For example, in the voltage sensing device shown in FIGS. 1 and 5, any pair of voltage input nodes can be selected from three or more voltage input nodes and connected to the pair of sensing input nodes, so that it is possible to sense the voltage of a group of cells connected in series.

Also, current sources CMk and CMk-1 of current supply part 70 shown in FIG. 10 supply offset current to inserted connection nodes of the resistors connected in series, but the present invention is not limited to this. For example, offset current may be supplied to one end of the input resistors (voltage input node side or sensing input node side). Here, as shown in formula (4), as resistors Rs11 and Rs31 are larger, sensitivity to error E1 relative to variation in offset current Ia and Ib is higher, so that it is sometimes preferable that resistors Rs12 and Rs32 be provided so that resistors Rs11 and Rs31 will have suitably small values.

All the current sources (CM0-CMn) of current supply part 70 may also be consolidated in one of the circuit configurations shown in FIGS. 11(A) and 11(B), and the two types of circuit configurations may be mixed. For example, input resistors RI0-RIn may be divided into two groups of high potential and low potential, the current source shown in FIG. 11(B) may be used for the input resistors in the high potential group, and the current source shown in FIG. 11(A) may be used for the input resistors in the low potential group. In this case, offset current can be supplied by the respective current sources shown in FIGS. 11(A) and 11(B) to the input resistors belonging to the two groups.

The invention claimed is:

1. A voltage sensing device comprising:
    multiple voltage input nodes;
    a pair of sensing input nodes;
    a first sensed signal generating part that holds both sensing input nodes of said pair at a reference potential while generating current input to said pair of sensing nodes at values determined by feedback elements, and that generates a pair of first sensed signals according to said generated current;
    a switch part provided with multiple switches that turn on or off connections between said multiple voltage sensing nodes and said pair of sensing input nodes;
    input resistors, that have approximately equal resistance values, provided in the current paths between said multiple input nodes and said switch part;
    a control part that controls said switch part to select a pair of voltage input nodes from said multiple voltage input nodes and connect this selected pair of voltage input nodes and said pair of sensing input nodes in two types of patterns having opposite polarity for each selected pair; and
    a second sensed signal generating part that generates a second sensed signal according to a difference between said pair of first sensed signals generated by said first sensed signal generating part with said two types of connection patterns, whereby offset in measuring said sensed voltage is reduced or cancelled.

2. The voltage sensing device described in claim 1, wherein said first sensed signal generating part comprises:
    a first amplifying part that amplifies the difference between the voltage at one sensing input node and said reference voltage;
    a second amplifying part that amplifies the difference between a first resistor connecting the output node of said first amplifying part and said one sensing input node, and between the voltage at another sensing input node and said reference voltage; and
    a second resistor that connects the output node of said second amplifying part and said other sensing input node, and a third resistor that connects the output node of said first amplifying part and said other sensing input node, wherein said first and second resistors control gain of said first and second amplifying parts.

3. The voltage sensing device described in claim 2 comprising:
- multiple sensing modules comprising said multiple input resistors, said switch part, said pair of sensing input nodes, and said first sensed signal generating part; and
- a selection part that selects one of the sensing modules, from said multiple sensing modules, and inputs said first sensed signal generated by said first sensed signal generating part of said selected sensing module to said second sensed signal generating part.

4. The voltage sensing device described in claim 2 comprising:
- a current supply part in a first checking node that supplies offset current to each of the current paths where said multiple input resistors are provided; and
- a first determination part in said first checking node that determines whether there are abnormalities in said input resistors, based on the difference between said second sensed signal generated when said offset current is supplied, and said second sensed signal generated when said offset current is not supplied.

5. The voltage sensing device described in claim 4 wherein said input resistor comprises multiple resistors connected in series; and
- said current supply part supplies said offset current to inserted connection nodes between said multiple resistors connected in series.

6. The voltage sensing device described in claim 2 wherein said multiple voltage input nodes comprise a pair of check nodes to which a reference voltage is input, said control part in a second checking node controls said switch part so that said pair of check nodes and said pair of sensing input nodes are connected in two types of patterns with different polarity; and
- wherein said voltage sensing device has a second determination part that determines whether there are abnormalities in said first sensed signal generating part, based on the difference between said second sensed signal generated in said second checking node and the reference value set according to said reference voltage.

7. The voltage sensing device described in claim 6 comprising:
- an analog-digital conversion part that converts said first sensed signal and said reference voltage to digital data signals; and
- wherein said second determination part determines whether there are abnormalities in said first sensed signal generating part, based on the difference between said second sensed signal generated according to the two digital data signals obtained by digitally converting the two said first sensed signals generated by said first sensed signal generating part in said second checking node, and said reference value corresponding to the digital data obtained by digitally converting said reference voltage.

8. The voltage sensing device described in claim 1 comprising:
- multiple sensing modules comprising said multiple input resistors, said switch part, said pair of sensing input nodes, and said first sensed signal generating part; and
- a selection part that selects one of the sensing modules, from said multiple sensing modules, and inputs said first sensed signal generated by said first sensed signal generating part of said selected sensing module to said second sensed signal generating part.

9. The voltage sensing device described in claim 1 comprising:
- a current supply part in a first checking node that supplies offset current to each of the current paths where said multiple input resistors are provided; and
- a first determination part in said first checking node that determines whether there are abnormalities in said input resistors, based on the difference between said second sensed signal generated when said offset current is supplied, and said second sensed signal generated when said offset current is not supplied.

10. The voltage sensing device described in claim 9 wherein said input resistor comprises multiple resistors connected in series; and
- said current supply part supplies said offset current to inserted connection nodes between said multiple resistors connected in series.

11. The voltage sensing device described in claim 1 wherein said multiple voltage input nodes comprise a pair of check nodes to which a reference voltage is input, said control part in a second checking node controls said switch part so that said pair of check nodes and said pair of sensing input nodes are connected in two types of patterns with different polarity; and
- wherein said voltage sensing device has a second determination part that determines whether there are abnormalities in said first sensed signal generating part, based on the difference between said second sensed signal generated in said second checking node and the reference value set according to said reference voltage.

12. The voltage sensing device described in claim 11 comprising:
- an analog-digital conversion part that converts said first sensed signal and said reference voltage to digital data signals; and
- wherein said second determination part determines whether there are abnormalities in said first sensed signal generating part, based on the difference between said second sensed signal generated according to the two digital data signals obtained by digitally converting the two said first sensed signals generated by said first sensed signal generating part in said second checking node, and said reference value corresponding to the digital data obtained by digitally converting said reference voltage.

13. A voltage sensing device comprising:
- a switch circuit coupled to multiple voltage input nodes, each of which is connected to an individual connection node of multiple cells connected in series, first and second voltage input nodes being selected by said switch circuit from among said multiple voltage input nodes, and connected to first and second nodes;
- and wherein said voltage sensing circuit comprises:
- a first operational amplifier, the negative input terminal of which is connected to said first node and the positive terminal of which is connected to a voltage supply terminal;
- a second operational amplifier, the negative input terminal of which is connected to said second node and the positive input terminal of which is connected to said voltage supply terminal;
- a first resistor connected between an output terminal and the negative input terminal of said first operational amplifier;
- a second resistor connected between an output terminal and the negative input terminal of said second operational amplifier, and a third resistor connected between the output terminal of said first operational amplifier and the negative input terminal of said second operational amplifier; and wherein when said first voltage input node and said first node are connected, and said second voltage input node and said second node are connected, said voltage sensing circuit outputs a first sensed voltage at said output of said first operational amplifier;

wherein when said second voltage input node and said first node are connected, said first voltage input node and said second node are connected, said voltage sensing circuit outputs a second sensed voltage; and voltage being applied to said two selected voltage input nodes, is determined based on the difference between said first sensed voltage and said second sensed voltage at the output of the second operational amplifier.

14. The voltage sensing device described in claim 13 comprising:

multiple current source circuits for supplying a prescribed current; and circuitry for checking input resistors based on the sensed voltage between said two selected voltage input nodes that is sensed when said current source circuits supply said prescribed current to connected points between fourth and fifth resistors, and on the sensed voltage between said two selected voltage input nodes that is sensed when said current source circuits do not supply said prescribed current to connected points between said fourth and fifth resistors.

15. The voltage sensing device described in claim 13 comprising:

first and second check nodes;

a voltage supply circuit that applies a prescribed voltage between said first and second check nodes;

and a switch part for selectively connecting said first and second check nodes and said first and second nodes, wherein said voltage sensing circuit is checked by circuitry for comparing a first voltage value sensed using said voltage sensing circuit and a reference value based on said prescribed voltage by switching the connections between said first and second check nodes and said first and second nodes.

* * * * *